(12) United States Patent
Lee et al.

(10) Patent No.: US 6,255,688 B1
(45) Date of Patent: *Jul. 3, 2001

(54) CAPACITOR HAVING ALUMINUM ALLOY BOTTOM PLATE

(75) Inventors: Kuo-Hua Lee; Sailesh M. Merchant, both of Orlando, FL (US)

(73) Assignee: Agere Systems Guardian Corp., Orlando, FL (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/975,793

(22) Filed: Nov. 21, 1997

(51) Int. Cl.$^7$ ................................................. H01L 27/108
(52) U.S. Cl. ......................... 257/311; 257/306; 257/310
(58) Field of Search .................................... 257/310, 306, 257/311

(56) References Cited

U.S. PATENT DOCUMENTS

| | | | |
|---|---|---|---|
| 3,781,610 | * 12/1973 | Bodway | 257/310 |
| 3,819,990 | * 6/1974 | Hayashi et al. | 361/313 |
| 5,104,826 | * 4/1992 | Fujita et al. | 438/643 |
| 5,335,138 | * 8/1994 | Sandhu et al. | 361/303 |
| 5,641,994 | * 6/1997 | Bollinger et al. | 257/771 |
| 5,656,536 | * 8/1997 | Wu | 438/397 |
| 5,837,593 | * 11/1998 | Park et al. | 438/396 |
| 5,970,309 | * 10/1999 | Ha et al. | 438/3 |

FOREIGN PATENT DOCUMENTS 4-43674 * 2/1992 (JP) ..................................... 257/310

* cited by examiner

*Primary Examiner*—Eddie C. Lee
*Assistant Examiner*—George C. Eckert, II

(57) ABSTRACT

The present invention provides for use with an integrated circuit, an embedded memory having a transistor in contact with an interconnect formed within a dielectric layer overlaying the transistor. In one embodiment, the embedded memory comprises a capacitor located on the dielectric layer that contacts the interconnect. In this particular embodiment, the capacitor includes a first electrode located on the interconnect wherein the first electrode is a layer of aluminum, aluminum alloy or titanium nitride and substantially free of a titanium layer. In one advantageous embodiment, the first electrode layer is an aluminum alloy. Moreover, the thickness of the first electrode may, of course, varying depending on the design. However, in one is particular embodiment, the first electrode may have a thickness ranging from about 10 nm to about 50 nm.

12 Claims, 3 Drawing Sheets

CAPACITOR HAVING ALUMINUM ALLOY BOTTOM PLATE

TECHNICAL FIELD OF THE INVENTION

The present invention is directed, in general, to integrated circuits and, more specifically, to an integrated circuit that includes an embedded dynamic random access memory having a capacitor associated therewith.

BACKGROUND OF THE INVENTION

Integrated circuits in general, and CMOS devices in particular, have continued to gain wide spread usage as user demands for increased functionality and enhanced benefits continues to increase. In order to meet this demand, the integrated circuit industry continues to decrease the size of circuit structures in order to place more circuits in the same size integrated circuit area thereby continuously increasing the packing density for a given chip size. Over the last several years, structures have gone from 1.2 micron gate areas (1 Meg capacity) in the past, down to gate structure areas of 0.25 microns (256 Meg capacity) currently and promise to become even smaller in the near future.

The ever increasing demand for computer memory to facilitate calculations and data storage have fostered intense development efforts in the area of Dynamic Random Access Memory (DRAM). The DRAM is generally a collection of transistor devices with each having an integrated circuit capacitor typically connected to its source electrode thereby forming a memory cell. This collection of memory cells is then arranged into a memory structure using a word line and a bit line to address each memory cell. This integrated capacitor may store an electrical charge to represent a logical "1" or store no electrical charge for a logical "0" as instructed by the word and bit control lines.

Construction of these memory capacitors consists of using typically a tungsten (W) plug structure for 0.25 micron technology connected to the source of the transistor, which then supports a barrier layer, a bottom electrode, a dielectric material, such as tantalum pentoxide and then a top electrode in sequence.

As the size technology of CMOS devices continues to shrink, the structure for a given memory size or circuit capability also shrinks as noted above. However, the bond pads which allow the integrated circuit to connect to external circuitry cannot continue to shrink indefinitely. Currently, an integrated circuit package may have about 200 bond pads that are 50 microns by 50 microns in size. Shrinking topology coupled with this bond pad lower limitation results in an excess of empty space around the bond pads. This allows for the inclusion of additional embedded memory around the bond pads.

In an attempt to add the above-mentioned memory in certain conventional CMOS technologies, some manufacturers have used titanium (Ti) to form a barrier layer with a titanium nitride (TiN) lower electrode in conjunction with the use of tantalum pentoxide ($Ta_2O_5$) as the dielectric layer of the capacitor. Unfortunately, however, in these cases, the edges of the Ti/TiN is exposed and in contact with the $Ta_2O_5$ which causes the Ti to chemically reduce the $Ta_2O_5$ creating electrical leakage paths or shorts. This results in general circuit performance degradation or failure.

Accordingly, what is needed in the art is a CMOS structure and a process of fabrication therefore in which embedded memory can be added without substantial changes in the fabrication processes typically used to manufacture CMOS technologies.

SUMMARY OF THE INVENTION

To address the above-discussed deficiencies of the prior art, the present invention provides for use with an integrated circuit, an embedded memory having a transistor in contact with an interconnect formed within a dielectric layer overlaying the transistor. In one embodiment, the embedded memory comprises a capacitor located on the dielectric layer that contacts the interconnect. In this particular embodiment, the capacitor includes a first electrode located on the interconnect wherein the first electrode is a layer of aluminum, aluminum alloy or titanium nitride and substantially free of a titanium layer. In one advantageous embodiment, the first electrode layer is an aluminum alloy. Moreover, the thickness of the first electrode may, of course, vary depending on the design. However, in one particular embodiment, the first electrode may have a thickness ranging from about 10 nm to about 50 nm.

Thus, the present invention provides an embedded memory structure having a capacitor associated therewith wherein the metals within the electrodes do not chemically react with the capacitor dielectric in such a way as to degrade the dielectric or cause general degradation of the device. As previously mentioned, some prior art materials chemically reacted with the capacitor dielectric by reducing the dielectric, which in turn, caused leakage within the device and ultimately device failure.

In the present invention, the capacitor further includes a capacitor dielectric located on the first electrode, which is subject to reduction by titanium. For example, in one embodiment, the capacitor dielectric may be tantalum pentoxide. Additionally, the capacitor includes a second electrode located on the capacitor dielectric.

In those embodiments where the first electrode is an aluminum alloy, the aluminum alloy may include copper. In yet another embodiment, the first electrode layer may be titanium nitride.

In another embodiment, the first electrode includes a barrier layer in contact with the interconnect. The barrier layer serves to prevent or inhibit cross diffusion of diverse materials. In such embodiments, the barrier layer may be comprised of aluminum alloy. In yet other embodiments, the barrier layer may be titanium nitride wherein the titanium has a thickness less than 30 nm.

The foregoing has outlined, rather broadly, preferred and alternative features of the present invention so that those skilled in the art may better understand the detailed description of the invention that follows. Additional features of the invention will be described hereinafter that form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention in its broadest form.

BRIEF DESCRIPTION OF THE DRAWINGS

For a more complete understanding of the present invention, reference is now made to the following descriptions taken conjunction with the accompanying drawings, in which.

DETAILED DESCRIPTION

Figure 1:
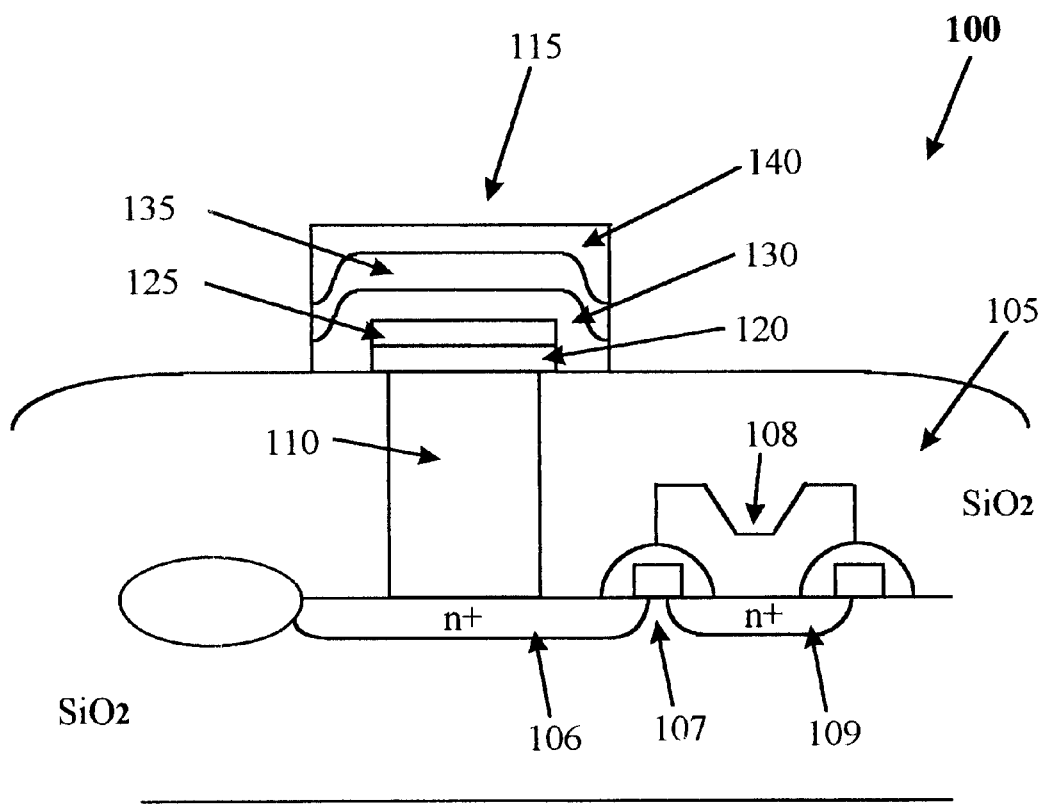
FIG. 1 illustrates cross-sectional view of a prior art embedded memory cell structure.

Referring initially to FIG. 1, illustrated is a prior art embedded memory cell structure 100, showing a transistor structure 105, an interconnect 110, and a memory capacitor 115. The memory capacitor 115, comprises an adhesion/barrier layer 120, a bottom electrode 125, a dielectric material 130, a top electrode 135, and a top plate 140. As stated earlier, tungsten (W) is typically used for 0.25 micron technology to form the interconnect 110. In FIG. 1, titanium (Ti) is used to form the adhesion/barrier layer 120, with titanium nitride (TiN) forming the bottom or first electrode 125. The dielectric layer 130 is then formed using tantalum pentoxide ($Ta_2O_5$), and titanium nitride (TiN) forms the top or second electrode 135. Finally, aluminum-alloy forms the top cap 140.

As stated earlier, the edges of the Ti/TiN layers are exposed to and in contact with the $Ta_2O_5$ which causes the Ti to chemically reduce the $Ta_2O_5$. This results in electrical leakage paths or shorts causing general circuit performance degradation or failure and therefore poor device reliability.

Figure 2:
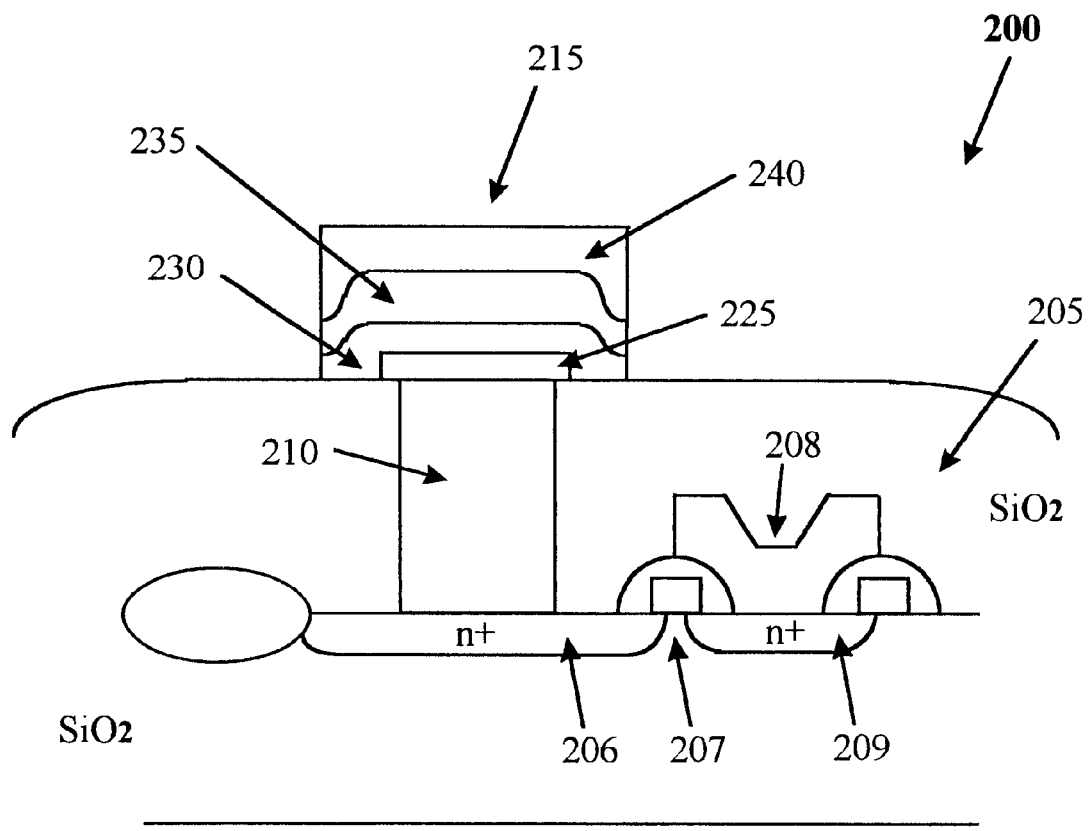
FIG. 2 illustrates a cross-sectional view of one embodiment of an embedded memory cell structure covered by the present invention.

Turning now to FIG. 2, illustrated is a preferred embodiment of an embedded memory cell structure 200 showing a transistor structure 205, and an interconnect 210 contacting a memory capacitor 215. The memory capacitor 215, comprises a first electrode 225 located on the interconnect, a dielectric material 230 located on the first electrode, a second electrode 235 located on the dielectric material, and a top plate 240 as shown. In one embodiment as shown in FIG. 2, the first electrode 225 located on the interconnect may be formed from aluminum (Al), an aluminum alloy (Al-alloy), titanium nitride (TiN), or any combination thereof. In an advantageous embodiment, the first electrode 225 may be deposited to a thickness of about 10 nm to about 50 nm at a temperature ranging from about 150° C. to about 400° C., under a pressure ranging from about 2 milliTorr to about 4 milliTorr. The deposition of the first electrode 225 may be accomplished by physical vapor deposition at a power ranging from about 6 to about 12 kilowatts. The dielectric layer 230 is then formed and blanketed on first electrate 225 tantalum pentoxide ($T_aO_5$) by conventional deposition processes. Titanium nitride (TiN) may be used to form the second electrode 235 by using conventional processes. However, it should be noted that aluminum or aluminum-alloy may also be used to form the second electrode 235 in place of the titanium nitride. Finally, aluminum or aluminum-alloy forms the top cap 240, which is used to make electrical connection. In certain embodiments, the aluminum-alloy may include copper.

The embodiment illustrated in FIG. 2 is substantially free of reactive titanium (Ti), which eliminates the possibility of adverse reactions with dielectric materials using tantalum pentoxide ($Ta_2O_5$). That is, there is not a sufficient amount of free elemental titanium to chemically react with or reduce the dielectric and cause an electrical degradation in the structure. It should be noted that it is believed that compounds containing titanium, such as titanium nitride, do not substantially affect the electrical integrity of the dielectric.

As shown, the first electrode 225 contacts the interconnect 210, which in turn, contacts the source region 206 of the transistor 205. The transistor 205 of the embedded memory may be of conventional design in that it also includes a word line 207, a bit line 208 and a drain region 209. A dielectric layer, such as silicon dioxide is formed over the transistor 205 to electrically isolate it.

Figure 3:
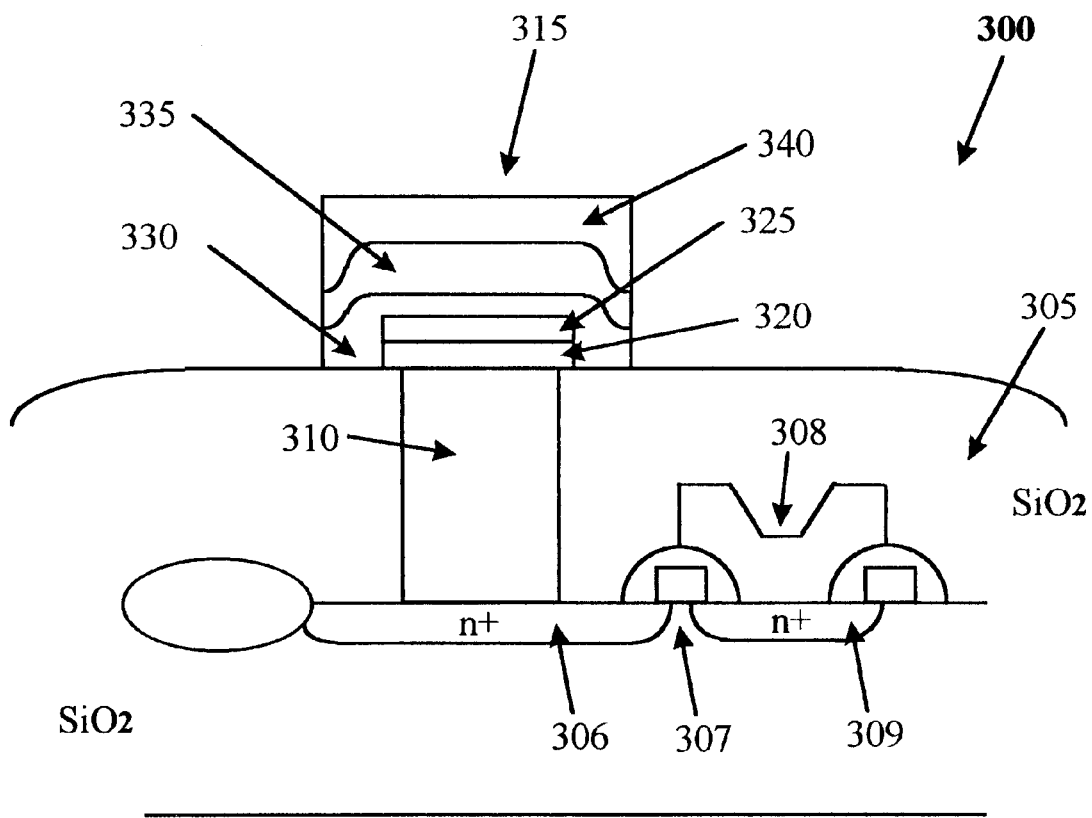
FIG. 3 illustrates a cross-sectional view of an alternate embodiment of an embedded memory cell structure covered by the present invention.

Turning now to FIG. 3, illustrated is an alternate embodiment of an embedded memory cell structure 300 which shows a transistor structure 305, and an interconnect 310 contacting a memory capacitor 315. The memory capacitor 315, comprises a barrier layer 320, first electrode 325, a dielectric material 330 located on the first electrode, a second electrode 335 located on the dielectric material, and a top plate 340 as shown. In the advantageous embodiment shown in FIG. 3, the barrier layer 320 located on the interconnect may be formed from titanium nitride (TiN) by conventional deposition processes, the first electrode 325 may be formed from aluminum (Al), an aluminum alloy (Al-alloy) or titanium nitride (TiN) under the same processing conditions stated above regarding FIG. 2. The dielectric layer 330 may then be formed and blanketed on top of the first electrode 325 using tantalum pentoxide ($T_aO_5$) by conventional deposition processes. Titanium nitride (TiN) forms the second electrode 335. Finally, aluminum-alloy forms the top cap 340.

This structure is also substantially free of reactive titanium (Ti) and eliminates the possibility of adverse reactions with dielectric materials using tantalum pentoxide ($Ta_2O_5$). Aluminum-alloys may also include those that are formed with copper.

From the foregoing, it is readily apparent that the present invention provides for use with an integrated circuit, an embedded memory having a transistor in contact with an interconnect formed within a dielectric layer overlaying the transistor. The embedded memory may comprise a capacitor located on the dielectric layer that contacts the interconnect. The capacitor preferably includes a first electrode located on the interconnect wherein the first electrode is a layer of aluminum, aluminum alloy or titanium nitride and substantially free of a titanium layer. In one advantageous embodiment, the first electrode layer is an aluminum alloy. Moreover, the first electrode may have a thickness ranging from about 10 nm to about 50 nm.

Although the present invention has been described in detail, those skilled in the art should understand that they can make various changes, substitutions and alterations herein without departing from the spirit and scope of the invention in its broadest form.

What is claimed is:

1. For use with an integrated circuit, an embedded memory having a transistor in contact with an interconnect formed within a dielectric layer overlaying said transistor, comprising:
    a capacitor located on the dielectric layer and contacting said interconnect, said capacitor including:
        a first electrode located on said interconnect wherein said first electrode is a layer of aluminum or aluminum alloy and substantially free of a titanium layer and includes a barrier layer in contact with said interconnect wherein the barrier layer is an aluminum alloy;
        a capacitor dielectric located on said first electrode, said capacitor dielectric subject to reduction by titanium; and
        a second electrode located on said capacitor dielectric.

2. The embedded memory as recited in claim 1 wherein said capacitor dielectric is tantalum pentoxide.

3. The embedded memory as recited in claim 1 wherein said aluminum alloy includes copper.

4. The embedded memory as recited in claim 1 wherein said barrier layer is titanium nitride and has a thickness less than 30 nm.

5. The embedded memory as recited in claim 1 wherein said first electrode has a thickness ranging from about 10 nm to about 50 nm.

6. The embedded memory as recited in claim 1 wherein said first electrode layer is aluminum alloy.

7. A complementary metal oxide semiconductor (CMOS) integrated circuit, comprising:
- an embedded memory having a transistor in contact with an interconnect formed within a dielectric layer overlaying said transistor device, said embedded memory electrically connected to said integrated circuit; and
- a capacitor located on said dielectric layer and contacting said interconnect, said capacitor including:
    - first electrode located on said interconnect wherein said first electrode is a layer of aluminum or aluminum alloy and substantially free of a titanium layer and includes a barrier layer in contact with said interconnect;
    - a capacitor dielectric comprising tantalum pentoxide located and blanketing on said first electrode, said dielectric subject to reduction by titanium; and
    - a second electrode comprised of titanium nitride located on said capacitor dielectric.

8. The CMOS integrated circuit as recited in claim 7 wherein said first electrode includes a barrier layer in contact with said capacitor dielectric and located between said first electrode and said dielectric layer, wherein said barrier layer is aluminum, aluminum alloy or titanium nitride and substantially free of a titanium layer.

9. The CMOS integrated circuit as recited in claim 8 wherein said barrier layer is titanium nitride and has a thickness less than 30 nm.

10. The CMOS integrated circuit as recited in claim 7 wherein said first electrode has a thickness ranging from about 10 nm to about 50 nm.

11. For use with an integrated circuit, an embedded memory having a transistor in contact with an interconnect formed within a dielectric layer overlaying said transistor, comprising:
- a barrier layer formed on and contacting said interconnect, said barrier layer substantially free of a titanium layer;
- capacitor located on said barrier layer and contacting said interconnect, said capacitor including:
    - a first electrode located on said barrier layer wherein said first electrode is a layer of aluminum or aluminum alloy and substantially free of a titanium layer;
    - a tantalum pentoxide capacitor dielectric located on said first electrode; and
    - a second electrode located on said tantalum pentoxide capacitor dielectric.

12. A complementary metal oxide semiconductor (CMOS) integrated circuit, comprising:
- an embedded memory having a transistor in contact with an interconnect formed within a dielectric layer overlaying said transistor device, said embedded memory electrically connected to said integrated circuit;
- a barrier layer formed on and contacting said interconnect, said barrier layer substantially free of a titanium layer; and
- a capacitor located on said barrier and in electrical contact with said interconnect, said capacitor including:
    - a first electrode located on said barrier layer wherein said first electrode is a layer of aluminum or aluminum alloy and substantially free of a titanium layer;
    - a tantalum pentoxide capacitor dielectric layer located on said first electrode; and
    - a second electrode comprised of titanium nitride located on said tantalum pentoxide capacitor dielectric.

* * * * *